United States Patent
Malone et al.

(10) Patent No.: US 7,273,088 B2
(45) Date of Patent: Sep. 25, 2007

(54) ONE OR MORE HEAT EXCHANGER COMPONENTS IN MAJOR PART OPERABLY LOCATABLE OUTSIDE COMPUTER CHASSIS

(75) Inventors: Christopher Gregory Malone, Rocklin, CA (US); Glenn Cochran Simon, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 122 days.

(21) Appl. No.: 10/738,435

(22) Filed: Dec. 17, 2003

(65) Prior Publication Data
US 2005/0133200 A1 Jun. 23, 2005

(51) Int. Cl.
*H05K 7/20* (2006.01)
(52) U.S. Cl. ............... 165/80.4; 165/104.33; 257/714; 361/687; 361/698; 361/699
(58) Field of Classification Search ........... 165/122, 165/121, 104.33, 185, 80.4; 361/699, 698; 257/714; 174/15.1
See application file for complete search history.

(56) References Cited

U.S. PATENT DOCUMENTS

| | | | | |
|---|---|---|---|---|
| 3,387,648 A * | 6/1968 | Ward, Jr. et al. | ............. | 165/47 |
| 4,449,579 A * | 5/1984 | Miyazaki et al. | ...... | 165/104.33 |
| 5,285,347 A * | 2/1994 | Fox et al. | ............. | 361/699 |
| 5,287,244 A * | 2/1994 | Hileman et al. | ............. | 361/687 |
| 5,339,214 A * | 8/1994 | Nelson | ............. | 361/695 |
| 5,394,936 A * | 3/1995 | Budelman | ............. | 165/104.33 |
| 5,427,174 A | 6/1995 | Lomolino, Sr. et al. | | |
| 5,438,226 A * | 8/1995 | Kuchta | ............. | 307/125 |
| 5,555,156 A | 9/1996 | Decante | | |
| 5,646,824 A * | 7/1997 | Ohashi et al. | ............. | 361/699 |
| 5,682,289 A | 10/1997 | Schwegler et al. | | |
| 5,731,954 A * | 3/1998 | Cheon | ............. | 361/699 |
| 5,757,615 A | 5/1998 | Donahoe et al. | | |
| 5,934,368 A * | 8/1999 | Tanaka et al. | ............. | 165/233 |
| 5,940,270 A * | 8/1999 | Puckett | ............. | 361/699 |
| 5,940,288 A | 8/1999 | Kociecki | | |
| 5,995,368 A * | 11/1999 | Lee et al. | ............. | 361/695 |
| 5,999,403 A * | 12/1999 | Neustadt | ............. | 361/695 |
| 6,000,464 A * | 12/1999 | Scafidi et al. | ............. | 165/104.33 |
| 6,041,851 A * | 3/2000 | Diebel et al. | ............. | 165/104.33 |
| 6,061,237 A * | 5/2000 | Sands et al. | ............. | 361/695 |
| 6,076,595 A * | 6/2000 | Austin et al. | ............. | 165/104.26 |
| 6,141,215 A | 10/2000 | Podwalny et al. | | |
| 6,166,907 A * | 12/2000 | Chien | ............. | 361/699 |
| 6,167,947 B1 | 1/2001 | Hokanson et al. | | |
| 6,234,240 B1 * | 5/2001 | Cheon | ............. | 165/80.3 |
| 6,313,990 B1 * | 11/2001 | Cheon | ............. | 361/699 |
| 6,333,849 B1 | 12/2001 | Donahoe et al. | | |
| 6,351,381 B1 * | 2/2002 | Bilski et al. | ............. | 361/695 |
| 6,412,292 B2 * | 7/2002 | Spinazzola et al. | ............. | 62/89 |
| 6,462,949 B1 * | 10/2002 | Parish et al. | ............. | 361/699 |
| 6,496,367 B2 | 12/2002 | Donahoe et al. | | |

(Continued)

FOREIGN PATENT DOCUMENTS

EP 0 539 341 10/1992

(Continued)

*Primary Examiner*—Leonard R Leo (57) ABSTRACT

One or more heat exchanger components of an apparatus are in major part operably locatable outside a computer chassis and serve to reduce one or more temperatures of one or more heat producing components supported with the computer chassis.

30 Claims, 1 Drawing Sheet

U.S. PATENT DOCUMENTS

| | | |
|---|---|---|
| 6,501,654 B2 | 12/2002 | O'Connor et al. |
| 6,504,719 B2 * | 1/2003 | Konstad et al. ............. 361/698 |
| 6,549,414 B1 * | 4/2003 | Tokuhara et al. ........... 361/719 |
| 6,580,609 B2 | 6/2003 | Pautsch |
| 6,628,520 B2 | 9/2003 | Patel et al. |
| 6,646,879 B2 | 11/2003 | Pautsch |
| 6,657,121 B2 | 12/2003 | Garner |
| 6,801,428 B2 * | 10/2004 | Smith et al. ................. 361/687 |
| 6,804,116 B2 * | 10/2004 | Owens et al. ................ 361/699 |
| 7,012,807 B2 * | 3/2006 | Chu et al. ................... 361/699 |
| 2002/0196604 A1 * | 12/2002 | Lehman et al. ............. 361/688 |
| 2003/0128513 A1 * | 7/2003 | Wiley ......................... 361/695 |
| 2004/0008483 A1 * | 1/2004 | Cheon ......................... 361/687 |
| 2004/0050533 A1 * | 3/2004 | Chesser et al. ............... 165/46 |
| 2004/0072534 A1 * | 4/2004 | Wiley ......................... 454/184 |
| 2004/0120123 A1 * | 6/2004 | Mayer ......................... 361/725 |
| 2004/0150950 A1 * | 8/2004 | Brooks et al. ............. 361/687 |
| 2004/0250992 A1 * | 12/2004 | Aoki et al. ................ 165/80.3 |
| 2005/0133214 A1 * | 6/2005 | Pfahnl ......................... 165/185 |

FOREIGN PATENT DOCUMENTS

| | | |
|---|---|---|
| GB | 2 349 985 | 5/1999 |

* cited by examiner

FIG. 1

ONE OR MORE HEAT EXCHANGER COMPONENTS IN MAJOR PART OPERABLY LOCATABLE OUTSIDE COMPUTER CHASSIS

BACKGROUND

A computer system comprises one or more heat producing components supported with a chassis. The heat producing components in one example comprise integrated circuits, computer drives, and processors. The computer system employs a heat sink, a fan, and/or a heat exchanger component to reduce one or more temperatures of the heat producing components.

The heat sink in one example abuts the heat producing components. For example, the heat sink conducts heat from the heat producing components to reduce the temperatures of the heat producing components. The heat sink comprises a heat conducting metal or a heat conducting metal alloy. The heat sink in one example comprises one or more fins. The fins of the heat sink conduct heat from the heat producing components to reduce the temperatures of the heat producing components. In one example, a fan forces air against the fins of the heat sink to cause a dissipation of heat conducted from the heat producing components. In another example, the fan forces air against the heat producing components to reduce a temperature of the heat producing components.

The heat exchanger component in one example reduces the temperatures of the heat producing components. The heat exchanger component comprises one or more portions of tubing and one or more fins. The heat exchanger component passes a fluid through the portions of tubing. The portions of tubing in one example abut the heat producing components. For example, the fluid transfers heat from the heat producing components. Upon a transfer of heat from the heat producing component, the heat exchanger component passes the fluid through the fins to transfer heat from the fluid to the fins. The fins in one example dissipate the heat to reduce the temperatures of the heat producing components. A fan in one example forces air against the fins to aide in the dissipation of the heat.

SUMMARY

The invention in one implementation encompasses an apparatus. The apparatus comprises one or more heat exchanger components that in major part are operably locatable outside a computer chassis and serve to reduce one or more temperatures of one or more heat producing components supported with the computer chassis.

Another implementation of the invention encompasses an apparatus. The apparatus comprises means for passing a fluid against one or more heat producing components to promote a reduction of one or more temperatures of the one or more heat producing components. The apparatus comprises means for operably locating in major part outside of a computer chassis, the means for passing the fluid against one or more heat producing components.

Yet another implementation of the invention encompasses a method. One or more heat exchanger components are employed to reduce one or more temperatures of one or more heat producing components. The one or more heat exchanger components are operably located in major part outside of a computer chassis.

DESCRIPTION OF THE DRAWING

Features of exemplary implementations of the invention will become apparent from the description, the claims, and the accompanying drawing in which:

DETAILED DESCRIPTION

Referring to the BACKGROUND section above, the heat exchanger is located within the chassis of the computer system. As one shortcoming, locating the heat exchanger component inside the chassis takes up space that could otherwise be available for additional computer components. As another shortcoming, the chassis limits a size of the heat sink, the heat exchanger, and/or the fan. For example, due to the limited space within the chassis, the heat exchanger may not be large enough to sufficiently cool the heat producing components. Since the heat exchanger is located within the chassis, the heat exchanger exhausts heat within the chassis during operation. As yet another shortcoming, the chassis requires additional cooling mechanisms (e.g., additional cooling fans) to remove the exhausted heat from the chassis. As still another shortcoming, the fan and/or the heat sink may cause an electrical shock and/or physical shock to one or more computer components of the computer system that may damage the computer system. The fan and/or the heat sink may also become unsecured from the chassis, thus causing damage to one or more computer components of the computer system.

Figure 1:
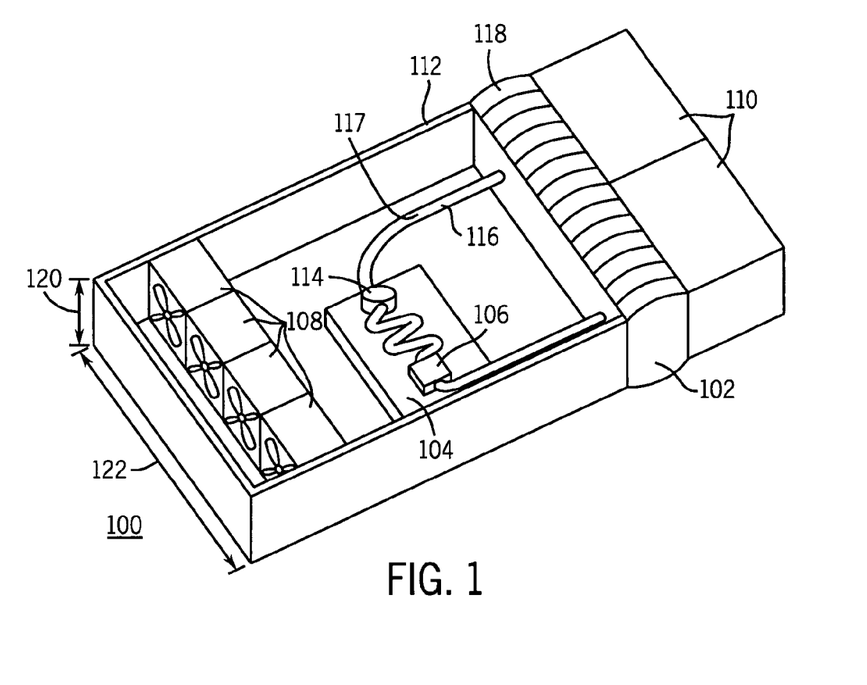
FIG. 1 is a representation of an exemplary implementation of an apparatus that comprises one or more heat exchanger components, one or more heat producing components, one or more cold plates, one or more fans, and a chassis.

Turning to FIG. 1, an apparatus 100 in one example comprises a plurality of components such as hardware components. A number of such components can be combined or divided in one example of the apparatus 100. The apparatus 100 in one example comprises any (e.g., horizontal, oblique, or vertical) orientation, with the description and figures herein illustrating one exemplary orientation of the apparatus 100, for explanatory purposes.

The apparatus 100 in one example comprises one or more heat exchanger components 102, one or more heat producing components 104, one or more cold plates 106, one or more fans 108 and 110, and a chassis 112. The heat exchanger component 102 in one example reduces one or more temperatures of the heat producing components 104.

The heat exchanger component 102 in one example comprises a pump component 114, one or more portions of tubing 116, and one or more fins 118. The pump component 114 passes a fluid 117 through the portions of tubing 116. For example, the heat exchanger component 102 moves the fluid 117 through the portions of tubing 116 to reduce the temperatures of the heat producing components 104. The fluid 117 transfers heat to the fins 118 to reduce a temperature of the fluid 117 and the temperatures of the heat producing components 104.

The heat producing component 104 in one example dissipates heat due to use in a computer system. The heat producing component 104 in one example comprises one or more of a processor and an integrated circuit mounted on a printed circuit board within the chassis 112. The heat producing component 104 transfers heat to the cold plate 106.

The cold plate 106 in one example abuts one or more of the heat producing component 104 and the portions of tubing 116 to enable a transfer of heat from the heat producing component 104 to the fluid 117 inside the portions of tubing 116. The cold plate 106 in one example comprises one or more of a heat conducting metal and a heat conducting metal alloy. The heat exchanger component 102 passes the fluid 117 through the portions of tubing 116. The cold plate 106 in one example transfers heat through the portions of tubing 116 to the fluid 117 from the heat producing component 104 by convection and/or conduction. For example, the heat exchanger component 102 serves to reduce the temperatures of the heat producing component 104.

Upon a transfer of the heat from the cold plate 106 to the fluid 117, the temperature of the fluid 117 increases and the temperature of the heat producing component 104 decreases. The fluid 117 in one example comprises a mixture of water and a coolant. The coolant in one example comprises ethylene glycol to prevent corrosion and/or low temperature freezing of the fluid 117.

The heat exchanger component 102 employs the pump component 114 to move the fluid 117 through the portions of tubing 116. The pump component 114 pumps the fluid 117 to the cold plate 106 for the transfer of heat from the heat producing component 104 to the fluid 117. Upon the transfer of heat from the heat producing component 104, the pump component 114 moves the fluid 117 from the cold plate 106 to the fins 118. The fins 118 abut the portions of the tubing 116. For example, the portions of the tubing 116 travel through the fins 118. The fins comprise one or more of a heat conducting metal and heat conducting metal alloy. One or more of the portions of the tubing 116 and the fins 118 in one example comprise one or more heat transfer sections. The fluid 117 passes through the heat transfer sections of the portions of tubing 116 to transfer heat to the heat transfer sections of the fins 118 through convection and/or conduction. The fluid 117 in one example transfers the heat to the fins 118 to reduce a temperature of the fluid 117.

Upon a decrease in the temperature of the fluid 117, the heat exchanger component 102 in one example passes the fluid 117 through the portions of tubing 116 to reduce a temperature of another one of the one or more heat producing components 104. For example, the pump component 114 circulates the fluid 117 through the portions of tubing 116 in a closed loop system.

The heat exchanger component 102 in one example promotes a dissipation of heat through the fins 118. Upon the dissipation of heat through the fins 118, the fins 118 in one example absorb more heat from the fluid 117. In one example, the heat exchanger component 102 causes the dissipation of heat through an employment of natural convection. In another example, the heat exchanger component 102 employs one or more fans 108 and 110 to dissipate the heat. For example, the fans 108 and 110 force air against the fins 118 to cause the dissipation of heat. In one example, the fans 108 are located inside the chassis 112. In another example, the fans 110 are located outside the chassis 112. The fans 110 located outside the chassis 112 may be larger than the fans 108 located inside the chassis 112. For example, the size of the fans 110 is not limited by the interior size of the chassis.

The chassis 112 in one example comprises a computer chassis or server case. The chassis 112 has height 120 and width 122. The width 122 in one example is 43 cm (17 inches). The height 120 in one example may be measured in 1 U units. For example, 1 U equals 4.4 cm (1.75 inches). The fans 108 may have a width and/or a height as large as the width 122 and the height 120 of the chassis 112. One or more of the computer or server cases in one example fit into a rack. For example, the rack has the width 122 of 43 cm and a height 120 of 42 U. The fans 110 may have a width and/or a height as large as the width and the height of the rack. Where the fans 110 have the width and/or the height as large as the width and the height of the rack, the fans 110 are able to force more air against the heat exchanger component 102 than for a smaller fan. For example, the fans 110 dissipate a greater amount of heat from the fins 118 than for the smaller fan.

The heat exchanger component 102 in major part is operably locatable outside of the chassis 112 to promote an increase in one or more of efficiency, serviceability, and flexibility of the heat exchanger component 102. The fins 118 in one example comprise the major part of the heat exchanger component 102. For example, the fins 118 are located outside the chassis during operation of the heat exchanger component 102. In one example, locating the heat exchanger component 102 in major part outside of the chassis 112 increases space inside of the chassis 112. For example, locating the heat exchanger component 102 outside of the computer chassis 112 allows for extra space inside of the computer chassis 112 than if the heat exchanger component 102 were located inside the chassis 102. Locating the heat exchanger component 102 outside of the computer chassis 112 makes available the extra space for placement of one or more additional computer components. The computer components in one example comprise one or more of a circuit board, a processor, and the fan 108.

In another example, locating the heat exchanger component 102 outside of the chassis 112 reduces heat transfer to objects from the heat exchanger component 102 to components within the chassis. For example, if the heat exchanger component 102 is located within the chassis 112, the heat exchanger component 102 transfers heat to the heat producing components 104. Locating the heat exchanger component 102 outside of the chassis 112 promotes an increase in an efficiency of a temperature reduction of the heat producing components 104. For example, where the location of the heat exchanger component 102 is outside of the chassis 112, one or more temperatures of the heat producing components 104 are lower than if the heat exchanger component 102 is located inside the chassis 112. The location of the heat exchanger component 102 outside of the chassis 112 promotes the increase in the efficiency of temperature reduction of the heat producing components 104 because the temperatures of the heat producing components 104 are lower than if the heat exchanger component 102 was located within the chassis 112.

In yet another example, locating the heat exchanger component 102 outside of the chassis 112 allows for the fans 110 to be larger than the fans 108. The fans 110 in one example are larger than the fans 108 because there is more open space outside of the chassis 112 than inside of the chassis 112. For example, the fans 110 can have a width and a height as large as the width 122 and the height 120 of the chassis 112. Where one or more chassis 112 fit into a rack, additional fans can be as large as the rack. The heat exchanger component 102 located outside of the chassis 112 may employ one or more of the fans 108, 110, and the additional fans to reduce one or more temperatures of the fins 118. Locating the heat exchanger component 102 outside of the chassis 112 in one example allows a natural convection to force air against the fins 118 to promote heat dissipation at the fins 118.

In still another example, a location of the heat exchanger component 102 outside of the chassis 112 promotes an ease in one or more of a accessibility and serviceability of the chassis 112. The location in one example promotes an ease in the accessibility of the chassis 112 to promote the ease of the serviceability of the chassis 112. For example, the location allows a user the ability to move the chassis 112 in and out of the rack without uncoupling the heat exchanger component 102 from the chassis 112. The location promotes an increase in the serviceability through an ability to fix or replace one or more of the fan 110 and the heat exchanger component 102.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
    a rack-mounted computer chassis that comprises a chassis major depth dimension sized to at least in major part extend into a rack contemporaneous with operation of the rack-mounted computer chassis and chassis minor vertical and horizontal dimensions sized to fit into the rack contemporaneous with operation of the rack-mounted computer chassis, wherein the chassis major depth dimension is larger than the chassis minor vertical dimension, wherein the chassis major depth dimension is larger than the chassis minor horizontal dimension; and
    one or more heat exchanger components that in major part are operably located outside the rack-mounted computer chassis and serve to reduce one or more temperatures of one or more heat producing components supported within the rack-mounted computer chassis;
    wherein the one or more heat exchanger components are coupled with one of a front or rear surface of the rack-mounted computer chassis, wherein vertical and horizontal dimensions of one or more respective major parts of the one or more heat exchanger components are substantially equal to and coupled in alignment with vertical and horizontal dimensions, of the chassis minor vertical and horizontal dimensions, of the one of the front or rear surface of the rack-mounted computer chassis;
    wherein a location of the one or more heat exchanger components at the front or rear surface of the rack-mounted computer chassis serves to allow a user to move the rack-mounted computer chassis in and out of the rack without uncoupling the one or more heat exchanger components from the rack-mounted computer chassis:
    wherein the one or more heat exchanger components comprise a particular heat exchanger component, wherein the particular heat exchanger component comprises one or more portions of tubing;
    wherein the particular heat exchanger component passes a fluid through the one or more portions of tubing to reduce one or more of the one or more temperatures of the one or more heat producing components;
    wherein the particular heat exchanger component comprises one or more fins with vertical and horizontal dimensions substantially equal to and coupled in alignment with the vertical and horizontal dimensions of the one of the front or rear surface of the rack-mounted computer chassis, wherein the fluid transfers heat to the one or more fins as the fluid passes through one or more of the one or more portions of tubing against the one or more fins;
    wherein the one or more fins promote a reduction in the one or more of the one or more temperatures of the one or more heat producing components;
    wherein the one or more fins are operably located outside the rack-mounted computer chassis, wherein the particular heat exchanger component dissipates heat through the one or more fins to reduce the one or more of the one or more temperatures of the one or more heat producing components;
    wherein the rack-mounted computer chassis comprises a rack-mounted computer server chassis, wherein the particular heat exchanger component comprises one or more fans located outside the rack-mounted computer server chassis that serve to force air against the one or more of the one or more fins to dissipate the heat, wherein the one or more fans located outside the rack-mounted computer server chassis are larger than one or more server system fans located inside the rack-mounted computer server chassis, wherein the one or more fans located outside the rack-mounted computer server chassis serve to dissipate the heat with or without cooperation with the one or more server system fans located inside the rack-mounted computer server chassis.

2. The apparatus of claim 1, wherein the one or more portions of tubing comprise one or more heat transfer sections, wherein the one or more heat transfer sections comprise a first heat transfer section that abuts the one or more heat producing components;
    wherein the particular heat exchanger component moves the fluid through the first heat transfer section to promote a transfer of heat from the one or more heat producing components, wherein the transfer of beat from the one or more heat producing components serves to reduce the one or more of the one or more temperatures of the one or more heat producing components;
    wherein the one or more heat transfer sections comprise a second heat transfer section that abuts the one or more fins, wherein the particular heat exchanger component moves the fluid against one or more of the one or more fins to transfer heat from the fluid to the one or more of the one or more fins.

3. The apparatus of claim 1, wherein the chassis minor vertical and horizontal dimensions and the vertical and horizontal dimensions of the one or more respective major parts of the one or more heat exchanger components comprise substantially constant vertical and horizontal dimensions.

4. The apparatus of claim 1, wherein the rack-mounted computer chassis comprises a rack-mounted computer server chassis that comprises a substantially constant chassis major depth dimension sized to at least in major part extend into the rack contemporaneous with operation of the rack-mounted computer chassis and substantially constant chassis minor vertical and horizontal dimensions sized to fit into the rack contemporaneous with operation of the rack-mounted computer chassis, wherein the vertical and horizontal dimensions of the one or more respective major parts of the one or more heat exchanger components are substantially equal to the substantially constant chassis minor vertical and horizontal dimensions of the rack-mounted computer server chassis.

5. The apparatus of claim 1, wherein the chassis minor vertical and horizontal dimensions and the vertical and horizontal dimensions of the one or more respective major parts of the one or more heat exchanger components comprise substantially constant vertical and horizontal dimensions, wherein die particular heat exchanger component comprises one or more pump components operably located Inside the rack-mounted computer chassis, wherein the one or more pump components move the fluid through the one or more portions of tubing.

6. The apparatus of claim 1, wherein the chassis minor vertical and horizontal dimensions and the vertical and horizontal dimensions of the one or more respective major parts of the one or more heat exchanger components comprise substantially constant vertical and horizontal dimensions, wherein the particular heat exchanger component comprises one or more cold plates that abut one or more of the one or more heat producing components;
 wherein one or more of the one or more portions of tubing pass trough the one or more cold plates;
 wherein the particular heat exchanger component passes the fluid through the one or more of the one or more portions of tubing to transfer heat from the one or more cold plates to the fluid;
 wherein the cold plates transfer the heat from the one or more cold plates to the fluid to reduce the one or more of the one or more temperatures of the one or more heat producing components.

7. The apparatus of claim 1, wherein the rack-mounted computer chassis comprises a rack-mounted computer server chassis that comprises a substantially constant chassis major depth dimension sized to at least in major part extend into the rack contemporaneous with operation of the rack-mounted computer chassis and substantially constant chassis minor vertical and horizontal dimensions sized to fit into the rack contemporaneous with operation of the rack-mounted computer chassis, wherein the vertical and horizontal dimensions of the one or more respective major parts of the one or more heat exchanger components are substantially equal to the substantially constant chassis minor vertical and horizontal dimensions of the rack-mounted computer server chassis, wherein the fluid comprises a mixture of water and a coolant, wherein the particular heat exchanger component employs the mixture of water and the coolant to reduce the one or more of the one or more temperatures of the one or more heat producing components.

8. The apparatus of claim 1, wherein the chassis minor vertical and horizontal dimensions and the vertical and horizontal dimensions of the one or more respective major parts of the one or more heat exchanger components comprise substantially constant vertical and horizontal dimensions, wherein the one of the front or rear surface of the rack-mounted computer chassis comprises an outer surface of the rack-mounted computer chassis, wherein the one or mare respective major parts of the one or more heat exchanger components are coupled to the outer surface of the rack-mounted computer chassis.

9. The apparatus of claim 8, wherein the rack-mounted computer chassis comprises a rack-mounted computer server chassis that comprises a substantially constant chassis major depth dimension sized to at least in major part extend into the rack contemporaneous with operation of the rack-mounted computer chassis and the substantially constant chassis minor vertical and horizontal dimensions sized to fit into the rack, wherein the one or more heat exchanger components comprise a particular heat exchanger component, wherein the outer surface comprises a rear outer surface of the rack-mounted computer server chassis;
 wherein the rack-mounted computer server chassis sits in the rack, wherein the size of the particular heat exchanger component allows removal of the rack-mounted computer server chassis and the particular heat exchanger component from the rack as a unit.

10. The apparatus of claim 8, wherein the rack-mounted computer chassis comprises a rack-mounted computer server chassis that comprises a substantially constant chassis major depth dimension sized to at least in major part extend into the rack contemporaneous wit operation of the rack-mounted computer chassis and the substantially constant chassis minor vertical and horizontal dimensions, wherein the substantially constant chassis minor vertical and horizontal dimensions are sized to fit into the rack contemporaneous with operation of the rack-mounted computer chassis, wherein the one or more heat exchanger components comprise a particular heat exchanger component, wherein a major part of the particular heat exchanger component is operably located at a location outside of the rack-mounted computer server chassis;
 wherein the location promotes an ease of accessibility to the major part of the particular heat exchanger component wherein the ease of accessibility promotes an ease of serviceability of the major part of the particular heat exchanger component.

11. The apparatus of claim 8, wherein the rack-mounted computer chassis comprises a rack-mounted computer server chassis that comprises a substantially constant chassis major depth dimension sized to at least in major part extend into the rack contemporaneous with operation of the rack-mounted computer chassis and the substantially constant chassis minor vertical and horizontal dimensions, wherein the substantially constant chassis minor vertical and horizontal dimensions are sized to fit into The rack contemporaneous with operation of the rack-mounted computer chassis, wherein the one or more heat exchanger components comprise a particular heat exchanger component, wherein the particular heat exchanger component is in major part operably located at a location outside of the rack-mounted computer server chassis;
 wherein a placement of the particular heat exchanger component at the location in major part outside of the rack-mounted computer server chassis rather than in major part inside the rack-mounted computer server chassis, promotes an increase in available space inside the rack-mounted computer server chassis, wherein the available space allows for a placement of one or more additional computer components within the rack-mounted computer server chassis.

12. The apparatus of claim 1, wherein The rack-mounted computer chassis comprises a rack-mounted computer server chassis that comprises a substantially constant chassis major depth dimension sized to at least in major part extend into the rack contemporaneous with operation of the rack-mounted computer chassis and substantially constant chassis minor vertical and horizontal dimensions sized to fit into the rack contemporaneous with operation of the rack-mounted computer chassis, wherein the vertical and horizontal dimensions of the one or more respective major parts of the one or more heat exchanger components are substantially equal to the substantially constant chassis minor vertical and horizontal dimensions of the rack-mounted computer server chassis, wherein the one or more heat producing components comprise one or more server system processors located within the rack-mounted computer server chassis, wherein the one or more heat exchanger components serve to reduce one or more of the one or more temperatures of the one or more server system processors.

13. The apparatus of claim 1, wherein the rack-mounted computer chassis comprises a rack-mounted computer server chassis that comprises a substantially constant chassis major depth dimension sized to at least in major pan extend into the rack contemporaneous with operation of the rack-mounted computer chassis and substantially constant chassis minor vertical and horizontal dimensions sized to fit into the rack contemporaneous with operation of the rack-mounted computer chassis, wherein the vertical and horizontal dimensions of the one or more respective major parts of the one or more heat exchanger components are substantially equal to the substantially constant chassis minor vertical and horizontal dimensions of the rack-mounted computer server chassis, wherein the one or more heat producing components comprise one or more server system circuit boards located within the rack-mounted computer server chassis, wherein the one or more heat exchanger components serve to reduce one or more of the one or more temperatures of the one or more server system circuit boards.

14. The apparatus of claim 1, wherein the rack-mounted computer chassis comprises a rack-mounted computer server chassis that comprises a substantially constant chassis major depth dimension sized to at least in major part extend into the rack and substantially constant chassis minor vertical and horizontal dimensions sized to fit into the rack contemporaneous with operation of the rack-mounted computer chassis, wherein the vertical and horizontal dimensions of the one or more respective major parts of the one or more beat exchanger components are substantially equal to the substantially constant chassis minor vertical and horizontal dimensions of the rack-mounted computer server chassis, wherein the rack supports the rack-mounted computer server chassis, wherein the one or more heat exchanger components comprise a particular hear exchanger component, wherein a major part of the particular heat exchanger component is accessible from an opening in a front or rear of the rack.

15. The apparatus of claim 1, wherein the rack-mounted computer chassis comprises a rack-mounted computer server chassis that comprises a substantially constant chassis major depth dimension sized to at least in major part extend into the rack contemporaneous wit operation of the rack-mounted computer chassis and substantially constant chassis minor vertical and horizontal dimensions sized to fit into the rack contemporaneous with operation of the rack-mounted computer chassis, wherein the vertical and horizontal dimensions of the one or more respective major parts of the one or more heat exchanger components are substantially equal to the substantially constant chassis minor vertical and horizontal dimensions of the rack-mounted computer server chassis, wherein the one or more heat producing components comprise one or more heat producing server system components located inside the rack-mounted computer server chassis, the apparatus further comprising one or more fans to force a stream of air over the one or more heat producing server system components and through the one or more heat exchanger components coupled with the one of the front or rear surface of the rack-mounted computer server chassis.

16. An apparatus, comprising:
a rack-mounted computer chassis that comprises a chassis major depth dimension sized to at least in major part extend into a rack contemporaneous with operation of the rack-mounted computer chassis and chassis minor vertical and horizontal dimension sized to fit into the rack contemporaneous with operation of the rack-mounted computer chassis, wherein the chassis major depth dimension is larger than the chassis minor vertical dimension, wherein the chassis major depth dimension is larger than the chassis minor horizontal dimension; and
one or more heat exchanger components that in major part are operably located outside the rack-mounted computer chassis and serve to reduce one or more temperatures of one or more heat producing components supported within the rack-mounted computer chassis
wherein the one or more heat exchanger components are counted with one of a front or rear surface of the rack-mounted computer chassis, wherein vertical and horizontal dimensions of one or more respective major parts of the one or more heat exchanger component are substantially equal to and coupled in alignment with vertical and horizontal dimensions, of the chassis minor vertical and horizontal dimensions, of the one of the front or rear surface of the rack-mounted computer chassis;
wherein a location of the one or more heat exchanger components at the front or rear surface of the rack-mounted computer chassis serves to allow a user to move the rack-mounted computer chassis in and out of the rack without uncoupling the one or more heat exchanger components from the rack-mounted computer chassis;
wherein the one or more heat exchanger components comprises a particular heat exchanger component, wherein the particular heat exchanger component comprises one or more portions of tubing;
wherein the particular heat exchanger component passes a fluid through the one or more portion of tubing to reduce one or more of the one or more temperature of the one or more heat producing components;
wherein the particular heat exchanger component comprises one or more fins with vertical and horizontal dimensions substantially equal to and coupled in alignment with the vertical and horizontal dimensions of the one of the front or rear surface of the rack-mounted computer chassis, wherein the fluid transfers heat to the one or more fins as the fluid passes through one or more of the one or more portions of tubing against the one or more fins;
wherein the one or more fins promote a reduction in the one or more of the one or more temperatures of the one or more heat producing components;
wherein the one or more fins are operably located outside the rack-mounted computer chassis wherein the particular heat exchanger component dissipates heat through the one or more fins to reduce the one or more of the one or more temperatures of the one or more heat producing components;
wherein the rack-mounted computer chassis comprises a rack-mounted computer server chassis, wherein the particular heat exchanger component comprises one or more fans located outside of the rack-mounted computer server chassis that serve to force air against the one or more of the one or more fins to dissipate the heat, wherein the one or more fans located outside the rack-mounted computer sewer chassis are one or more serviceable, fixable, and/or replaceable independent of one or more server system fans Located inside the rack-mounted computer server chassis, wherein the one or more fans located outside the rack-mounted computer server chassis serve to dissipate the heat with or without cooperation with the one or more sewer system fans located inside the rack-mounted computer server chassis.

17. The apparatus of claim 16, wherein the one or more portions of tubing comprise one or more heat transfer sections, wherein the one or more heat transfer sections comprise a first heat transfer section that abuts the one or more heat producing components; wherein the particular heat exchanger component moves the fluid through the first heat transfer section to promote a transfer of heat from the one or more heat producing components, wherein the transfer of heat from the one or more heat producing components serves to reduce the one or more of the one or more temperatures of the one or more beat producing components; wherein the one or more heat transfer sections comprise a second heat transfer section that abuts the one or more fins, wherein the particular heat exchanger component moves the fluid against one or more of the one or more fins to transfer heat from the fluid to the one or more of the one or more fins.

18. The apparatus of claim 16, wherein the chassis minor vertical and horizontal dimensions and the vertical and horizontal dimensions of the one or more respective major parts of die one or more heat exchanger components comprise substantially constant vertical and horizontal dimensions.

19. The apparatus of claim 16, wherein the rack-mounted computer chassis comprises a rack-mounted computer server chassis that comprises a substantially constant chassis major depth dimension sized to at least in major part extend into the rack contemporaneous with operation of the rack-mounted computer chassis and substantially constant chassis minor vertical and horizontal dimensions sized to fit into the rack contemporaneous with operation of the rack-mounted computer chassis, wherein the vertical and horizontal dimensions of the one or more respective major parts of the one or more heat exchanger components are substantially equal to the substantially constant chassis minor vertical and horizontal dimensions of the rack-mounted computer server chassis.

20. The apparatus of claim 16, wherein the chassis minor vertical and horizontal dimensions and the vertical and horizontal dimensions of the one or more respective major parts of the one or more heat exchanger components comprise substantially constant vertical and horizontal dimensions, wherein the particular heat exchanger component comprises one or more pump components operably located inside the rack-mounted computer chassis, wherein the one or more pump components move the fluid through the one or more portions of tubing.

21. The apparatus of claim 16, wherein the chassis minor vertical and horizontal dimensions and the vertical and horizontal dimensions of the one or more respective major parts of the one or more heat exchanger components comprise substantially constant vertical and horizontal dimensions, wherein the particular heat exchanger component comprises one or more cold plates that abut one or wore of the one or more heat producing components;

wherein one or more of the one or more portions of tubing pass through the one or more cold plates;

wherein the particular heat exchanger component passes the fluid through the one or more of the one or more portions of tubing to transfer heat from the one or more cold plates to the fluid;

herein the cold plates transfer the heat from the one or more cold plates to the fluid to reduce the one or more of the one or more temperatures of the one or more heat producing components.

22. The apparatus of claim 16, wherein the rack-mounted computer chassis comprises a rack-mounted computer server chassis that comprises a substantially constant chassis major depth dimension sized to at least in major part extend into the rack contemporaneous with operation of the rack-mounted computer chassis and substantially constant chassis major vertical and horizontal dimensions sized to fit into the rack contemporaneous with operation of the rack-mounted computer chassis, wherein the vertical and horizontal dimensions of the one or more respective major parts of the one or more heat exchanger components are substantially equal to the substantially constant chassis minor vertical and horizontal dimensions of the rack-mounted computer server chassis, wherein the fluid comprises a mixture of Water and a coolant, wherein the particular heat exchanger component employs the mixture of water and the coolant to reduce the one or more of the one or more temperatures of the one or more heat producing components.

23. The apparatus of claim 16, wherein the chassis minor vertical and horizontal dimensions and the vertical and horizontal dimensions of the one or more respective major parts of the one or more heat exchanger components comprise substantially constant vertical and horizontal dimensions, wherein the one of the front or rear surface of the rack-mounted computer chassis comprises an outer surface of the rack-mounted computer chassis, wherein the one or more respective major parts of the one or more heat exchanger components are coupled to the outer surface of the rack-mounted computer chassis.

24. The apparatus of claim 23, wherein the rack-mounted computer chassis comprises a rack-mounted computer server chassis that comprises a substantially constant chassis major depth dimension sized to at least in major part extend into the rack contemporaneous with operation of the rack-mounted computer chassis and the substantially constant chassis minor vertical and horizontal dimensions sized to fit into the rack, wherein the one or more heat exchanger components comprise a particular heat exchanger component, wherein the outer surface comprises a rear outer surface of the rack-mounted computer server chassis;

wherein the rack-mounted computer server chassis sits in the rack, wherein the size of the particular heat exchanger component allows removal of the rack-mounted computer server chassis and the particular heat exchanger component from the rack as a unit.

25. The apparatus of claim 23, wherein the rack-mounted computer chassis comprises a rack-mounted computer server chassis that comprises a substantially constant chassis major depth dimension sized to at least in major part extend into the rack contemporaneous with operation of the rack-mounted computer chassis and the substantially constant chassis minor vertical and horizontal dimensions, wherein the substantially constant chassis minor vertical and horizontal dimensions are sized to fit into the rack contemporaneous with operation of the rack-mounted computer chassis, wherein the one or more heat exchanger components comprise a particular heat exchanger component, wherein a major part of the particular heat exchanger component is operably located at a location outside of the rack-mounted computer server chassis;

wherein the location promotes an ease of accessibility to the major part of the particular heat exchanger component, wherein the ease of accessibility promotes an ease of serviceability of the major part of the particular heat exchanger component.

26. The apparatus of claim 23, wherein the rack-mounted computer chassis comprises a rack-mounted computer server chassis that comprises a substantially constant chassis major depth dimension sized to at least in major part extend into the rack contemporaneous with operation of the rack-mounted computer chassis and the substantially constant chassis minor vertical and horizontal dimensions, wherein the substantially constant chassis minor vertical and horizontal dimensions are sized to fit into the rack contemporaneous with operation of the rack-mounted computer chassis, wherein the one or more heat exchanger components comprise a particular heat exchanger component, wherein the particular heat exchanger component is in major part operably located at a location outside of the rack-mounted computer server chassis;

wherein a placement of the particular heat exchanger component at the location in major part outside of the rack-mounted computer server chassis rather than in major part inside the rack-mounted computer server chassis, promotes an increase in available space inside the rack-mounted computer server chassis, wherein the available space allows for a placement of one or more additional computer components within the rack-mounted computer server chassis.

27. The apparatus of claim 16, wherein the rack-mounted computer chassis comprises a rack-mounted computer server chassis that comprises a substantially constant chassis major depth dimension sized to at least in major part extend into the rack contemporaneous with operation of the rack-mounted computer chassis and substantially constant chassis minor vertical and horizontal dimensions sized to fit into the rack contemporaneous with operation of the rack-mounted computer chassis, wherein the vertical and horizontal dimensions of the one or more respective major parts of the one or more beat exchanger components are substantially equal to the substantially constant chassis minor vertical and horizontal dimensions of the rack-mounted computer server chassis, wherein the one or more heat producing components comprise one or more server system processors located within the rack-mounted computer server chassis, wherein the one or more heat exchanger components serve to reduce one or more of the one or more temperatures of the one or more server system processors.

28. The apparatus of claim 16, wherein the rack-mounted computer chassis comprises a rack-mounted computer server chassis that comprises a substantially constant chassis major depth dimension sized to at least in major part extend into the rack contemporaneous with operation of the rack-mounted computer chassis and substantially constant chassis minor vertical and horizontal dimensions sized to fit into the rack contemporaneous with operation of the rack-mounted computer chassis, wherein the vertical and horizontal dimensions of the one or more respective major parts of the one or more heat exchanger components are substantially equal to the substantially constant chassis minor vertical and horizontal dimensions of the rack-mounted computer server chassis wherein the one or more heat producing components comprise one or more server system circuit boards located within the rack-mounted computer server chassis, wherein the one or more heat exchanger components serve to reduce one or more of the one or more temperatures of the one or more server system circuit boards.

29. The apparatus of claim 16, wherein the rack-mounted computer chassis comprises a rack-mounted computer server chassis that comprises a substantially constant chassis major depth dimension sized to at least in major part extend into the rack and substantially constant chassis minor vertical and horizontal dimensions sized to fit into the rack contemporaneous with operation of the rack-mounted computer chassis, wherein the vertical and horizontal dimensions of the one or more respective major parts of the one or more heat exchanger components are substantially equal to the substantially constant chassis minor vertical and horizontal dimensions of the rack-mounted computer server chassis, wherein the rack supports the rack-mounted computer server chassis, wherein the one or more heat exchanger components comprise a particular heat exchanger component, wherein a major part of the particular heat exchanger component is accessible from an opening in a front or rear of the rack.

30. The apparatus of claim 16, wherein the rack-mounted computer chassis comprises a rack-mounted computer server chassis that comprises a substantially constant chassis major depth dimension sized to at least in major part extend into the rack contemporaneous with operation of the rack-mounted computer chassis and substantially constant chassis minor vertical and horizontal dimensions sized to fit into the rack contemporaneous with operation of the rack-mounted computer chassis, wherein the vertical and horizontal dimensions of the one or more respective major parts of the one or more heat exchanger components are substantially equal to the substantially constant chassis minor vertical and horizontal dimensions of the rack-mounted computer server chassis, wherein the one or more heat producing components comprise one or more heat producing server system components located inside the rack-mounted computer server chassis, the apparatus further comprising one or more fans to force a stream of air over the one or more heat producing server system components and through the one or more heat exchanger components coupled with the one of the front or rear surface of the rack-mounted computer server chassis.

* * * * *

UNITED STATES PATENT AND TRADEMARK OFFICE
CERTIFICATE OF CORRECTION

| | |
|---|---|
| PATENT NO. | : 7,273,088 B2 |
| APPLICATION NO. | : 10/738435 |
| DATED | : September 25, 2007 |
| INVENTOR(S) | : Christopher Gregory Malone et al. |

It is certified that error appears in the above-identified patent and that said Letters Patent is hereby corrected as shown below:

In column 5, line 56, in Claim 1, after "chassis" delete ":" and insert -- ; --, therefor.

In column 6, line 40, in Claim 2, delete "beat" and insert -- heat --, therefor.

In column 7, line 9, in Claim 5, delete "die" and insert -- the --, therefor.

In column 7, line 11, in Claim 5, delete "Inside" and insert -- inside --, therefor.

In column 7, line 23, in Claim 6, delete "trough" and insert -- through --, therefor.

In column 7, line 58, in Claim 8, delete "mare" and insert -- more --, therefor.

In column 8, line 14, in Claim 10, delete "wit" and insert -- with --, therefor.

In column 8, line 27, in Claim 10, insert -- . -- before "wherein".

In column 8, line 38, in Claim 11, delete "The" and insert -- the --, therefor.

In column 8, line 54, in Claim 12, delete "The" and insert -- the --, therefor.

In column 9, line 9, in Claim 13, delete "pan" and insert -- part --, therefor.

In column 9, line 34, in Claim 14, delete "beat" and insert -- heat --, therefor.

In column 9, line 39, in Claim 14, delete "hear" and insert -- heat --, therefor.

In column 9, line 47, in Claim 47, delete "wit" and insert -- with --, therefor.

In column 10, line 3, in Claim 16, delete "dimension" and insert -- dimensions --, therefor.

In column 10, line 14, in Claim 16, after "chassis" insert -- ; --.

In column 10, line 16, in Claim 16, delete "counted" and insert -- coupled --, therefor.

In column 10, line 19, in Claim 16, delete "component" and insert -- components --, therefor.

In column 10, line 33, in Claim 16, delete "comprises" and insert -- comprise --, therefor.

UNITED STATES PATENT AND TRADEMARK OFFICE
CERTIFICATE OF CORRECTION

PATENT NO. : 7,273,088 B2
APPLICATION NO. : 10/738435
DATED : September 25, 2007
INVENTOR(S) : Christopher Gregory Malone et al.

It is certified that error appears in the above-identified patent and that said Letters Patent is hereby corrected as shown below:

In column 10, line 37, in Claim 16, delete "portion" and insert -- portions --, therefor.

In column 10, line 38, in Claim 16, delete "temperature" and insert -- temperatures --, therefor.

In column 10, line 53, in Claim 16, after "chassis" insert -- , --.

In column 10, line 65, in Claim 16, delete "sewer" and insert -- server --, therefor.

In column 10, line 67, in Claim 16, delete "Located" and insert -- located --, therefor.

In column 11, line 4, in Claim 16, delete "sewer" and insert -- server --, therefor.

In column 11, line 18, in Claim 17, delete "beat" and insert -- heat --, therefor.

In column 11, line 30, in Claim 18, delete "die" and insert -- the --, therefor.

In column 11, line 64, in Claim 21, delete "wore" and insert -- more --, therefor.

In column 12, line 5, in Claim 21, delete "herein" and insert -- wherein --, therefor.

In column 12, line 16, in Claim 22, delete "major" and insert -- minor --, therefor.

In column 12, line 23, in Claim 22, delete "Water" and insert -- water --, therefor.

In column 13, line 43, in Claim 27, delete "beat" and insert -- heat --, therefor.

UNITED STATES PATENT AND TRADEMARK OFFICE
CERTIFICATE OF CORRECTION

PATENT NO. : 7,273,088 B2
APPLICATION NO. : 10/738435
DATED : September 25, 2007
INVENTOR(S) : Christopher Gregory Malone et al.

It is certified that error appears in the above-identified patent and that said Letters Patent is hereby corrected as shown below:

In column 14, line 9, in Claim 28, after "chassis" insert -- , --.

Signed and Sealed this

First Day of July, 2008

JON W. DUDAS
*Director of the United States Patent and Trademark Office*